United States Patent
Haueisen et al.

(10) Patent No.: US 7,358,735 B2
(45) Date of Patent: Apr. 15, 2008

(54) NMR PROBE HEAD WITH HEATED HOUSING

(75) Inventors: Ralf Haueisen, Karlsruhe (DE); Daniel Marek, Moeriken (CH); Marco Sacher, Uster (CH)

(73) Assignee: Bruker Biospin MRI GmbH, Ettlingen (DE)

( * ) Notice: Subject to any disclaimer, the term of this patent is extended or adjusted under 35 U.S.C. 154(b) by 0 days.

(21) Appl. No.: 11/637,076

(22) Filed: Dec. 12, 2006

(65) Prior Publication Data

US 2007/0139046 A1 Jun. 21, 2007

(30) Foreign Application Priority Data

Dec. 17, 2005 (DE) ............. 10 2005 060 447

(51) Int. Cl.
*G01V 3/00* (2006.01)
(52) U.S. Cl. ................ 324/318; 324/320
(58) Field of Classification Search ........ 324/300–322; 600/407, 455
See application file for complete search history.

(56) References Cited

U.S. PATENT DOCUMENTS

| | | | | |
|---|---|---|---|---|
| 5,247,256 | A * | 9/1993 | Marek ................ | 324/321 |
| 5,508,613 | A * | 4/1996 | Kotsubo et al. ....... | 324/318 |
| 5,694,775 | A | 12/1997 | Araoka | |
| 5,814,992 | A * | 9/1998 | Busse-Grawitz et al. ... | 324/318 |
| 5,913,888 | A | 6/1999 | Steinmeyer | |
| 6,194,900 | B1 * | 2/2001 | Freeman et al. ........ | 324/321 |
| 6,437,570 | B2 * | 8/2002 | Marek ................ | 324/321 |
| 6,466,019 | B2 * | 10/2002 | Marek ................ | 324/318 |
| 6,838,880 | B2 * | 1/2005 | Hofmann et al. ....... | 324/318 |
| 2001/0015646 | A1 | 8/2001 | Marek | |
| 2004/0004478 | A1 | 1/2004 | Hofmann | |

FOREIGN PATENT DOCUMENTS

DE         101 60 608         6/2003

OTHER PUBLICATIONS

"Animal Bed for BioSpec Systems". Brucker BioSpin MRI GmbH 2004.

* cited by examiner

*Primary Examiner*—Brij B. Shrivastav
(74) *Attorney, Agent, or Firm*—Paul Vincent

(57) ABSTRACT

An NMR probe head for investigating a temperature-sensitive test object in a volume under investigation with at least one RF receiver coil which is cooled to cryogenic temperatures during operation, and is surrounded by a housing, wherein at least one heatable separating wall is provided between the RF receiver coil and the test object, is characterized in that the separating wall is produced from a material having excellent heat conducting properties, wherein the separating wall is coupled in a heat conducting fashion to at least one heating element at a separation from the volume under investigation via at least one contact location. The inventive NMR probe head permits disposition of the RF receiver coil in close proximity to the test object to be measured without inadvertently cooling it.

22 Claims, 2 Drawing Sheets

NMR PROBE HEAD WITH HEATED HOUSING

This application claims Paris Convention priority of DE 10 2005 060 447.1 filed Dec. 17, 2005 the complete disclosure of which is hereby incorporated by reference.

BACKGROUND OF THE INVENTION

The invention concerns an NMR probe head for investigating a temperature-sensitive test object in a volume under investigation, comprising at least one RF receiver coil which is cooled to a cryogenic temperature during operation and is surrounded by a housing, wherein at least one heatable separating wall is provided between the RF receiver coil and the test object.

An NMR probe head of this type is disclosed in U.S. Pat. No. 5,694,775.

Magnetic resonance imaging utilizes RF receiver coils for exciting and receiving RF signals of the spins of a test object to be investigated. The inherent loss of small RF receiver coils plays a large role, whereas the loss in the test object, e.g. a patient or an animal, is secondary. In order to reduce the inherent loss of the RF receiver coils, the latter are cooled to cryogenic temperatures.

U.S. Pat. No. 5,913,888 discloses an NMR probe head having an RF receiver coil which is cooled using a pulse tube cooler and a non-metallic thermal contact body for transmitting refrigerating capacity of the pulse tube cooler to the RF receiver coil.

The manual "Animal support for BioSpec Systems—Operation Instructions and Specifications" of Bruker BioSpin MRI GmbH discloses an animal support 10 for use in NMR measurements on rodents. The conventional animal support has a tray-shaped structure with a chamber system through which heated water may be guided for controlling the temperature of the animal. The animal support also comprises a device for supplying anaesthetic or for artificial respiration of the animal. The temperature of the animal can be controlled via the animal support only from below and from the side of the animal, since the animal support is open at the top.

In order to obtain optimum signal quality, the RF receiver coils are disposed as closely as possible to the test object. Unless special measures are taken, thermal energy is transported from the separating wall to the cold RF receiver coil via black body radiation when the separations between the RF receiver coil and the separating wall are small. Since the temperature of the RF receiver coil is on the order of magnitude of 30K, and the temperature of the separating wall is equal to or slightly higher than room temperature, the thermal flow is generally very large and the separating wall is cooled in an undesired fashion. In particular, when the test objects are alive, this may have generally undesirable consequences (death of an animal, permanent damage due to undercooling, change of the molecular structure of the test object). To obtain optimum performance of the NMR probe head, the separating wall must be excellently thermally insulated from the cold RF receiver coil, and the separating wall must permit undamped passage of the RF signals (RF window).

This problem is solved in accordance with prior art in that heat is uniformly supplied along the surface of the separating wall. To this end, U.S. Pat. No. 5,694,775 proposes guiding of a liquid of a suitable temperature through a gap between the cooled RF receiver coil and the housing in order to keep the surface of the separating wall at the desired temperature.

Cooling of the test object is also conventionally prevented using a warm air flow. This may result in dry eyes, in particular, when living test objects are investigated.

DE 101 60 608 A1 discloses arrangement of a gas cushion between a separating wall of the housing and the measuring object, through which a gas of suitable temperature flows. The gap between the separating wall and the housing must thereby be sufficiently large for passage of the heating gas. This is, however, difficult to control and can produce undesired malfunction which may not be detected and cause local freezing of the test object. It is also very difficult to guide a temperature-controlled gas in a controlled and uniform fashion when the surfaces have complex curvatures.

The conventional devices pose the problem that the overall structure of the insulation need be sufficiently thick in order to prevent excessive cooling of the test object. On the other hand, the thickness of the separating wall including insulation must be sufficiently small so that the RF receiver coil is within an appropriate range within the signal source in the test object, in order to prevent unnecessary reduction of the signal/noise ratio. Due to the multi-layer structure of the conventional NMR probe heads and the required, relatively large thickness of the insulation layer and also of the gas- or liquid-carrying layer, the separations between the RF receiver coil and the test object are large (at least 2 mm). These separations are disproportionally large for applications with relatively small test objects (brain of a mouse) and greatly limit the signal/noise ratio that can be achieved.

Moreover, the fluids that are conventionally used for heating the space between the RF receiver coil and the test object may have a negative influence on the NMR measurement quality, since they are located close to the volume under investigation and for this reason, spins of the respective fluid could also be excited.

It is the underlying purpose of the invention to propose an NMR probe head with which the RF receiver coil may be disposed as closely as possible to the test object to be measured without inadvertently cooling it.

SUMMARY OF THE INVENTION

This object is achieved in accordance with the invention in that the separating wall is produced from a material having high heat-conducting properties, wherein the separating wall is coupled in a thermally conducting fashion to at least one heating element at a separation from the volume under investigation via at least one contact location.

The selected material ensures the required permeability for RF radiation (RF window) due to the low electric conductivity of the separating wall material, and its high thermal conductivity permits accurate supply of heat from outside of the measuring range to the area of the separating wall that abuts the test object.

Since the heating element is outside of the RF window, the RF fields are not damped by the presence of the conductors of the heating element in the volume under investigation. For this reason, any disturbance of the NMR experiment caused by the heating element, i.e. due to undesired magnetic fields ($B_0$ fields) or RF disturbances, can be prevented in the inventive NMR probe head. Even when a heating medium (e.g. gas, liquid) is used for coupling the heating element to the contact location of the separating wall, the heating element does not disturb the inventive device, since, in this case, the heating medium is also outside of the volume under investigation. Moreover, due to the external arrangement, the separation between the RF receiver coil and the test object may be minimized. In contrast to conventional NMR probe heads, the separation between the test object and the RF receiver coil can thereby be reduced in such a fashion that the test object contacts the separating wall, wherein e.g. a gas is guided along the surface of the separating wall (DE 101 60 608 A1). This is possible since, in the inventive NMR probe head, the gap for warming gas that flows along the surface of the separating wall can be omitted.

The housing may advantageously be evacuated. The cold RF receiver coil is particularly well thermally insulated relative to the separating wall using an insulating vacuum.

In a preferred embodiment of the inventive NMR probe head, the separating wall is part of the housing. The separating wall may alternatively have the shape of a tray which is glued onto the housing.

The thickness of the separating wall is advantageously less than 1 mm, preferably approximately ½ mm, since the signal/noise ratio improves with decreasing separation.

The separating wall is advantageously manufactured from a material that is poorly electrically conductive or is insulating. In a preferred embodiment, the electric conductance of the material of the separating wall at its operating temperature is less than $10^{-3}$ S/m, preferably less than $10^{-5}$ S/m, in particular less than $10^{-8}$ S/m. This ensures good permeability of the separating wall to RF radiation.

In an advantageous embodiment of the inventive NMR probe head, the thermal conductivity of the material of the separating wall at its operating temperature is more than 15 $WK^{-1}m^{-1}$, preferably more than 80 $WK^{-1}m^{-1}$.

The material of the separating wall advantageously comprises aluminium nitride (AlN), beryllium oxide (BeO), aluminium oxide ($Al_2O_3$), boron nitride (BN) or magnesium oxide (MgO). These materials have a high thermal conductivity and are also easy to process.

In an advantageous embodiment of the NMR probe head, the separation between the RF receiver coil and the volume under investigation is <2 mm, preferably ≦1 mm. The quality of the recordings may thereby be improved compared to the conventional NMR probe heads.

The housing is preferably produced from a ceramic material containing aluminium nitride, in particular from a machineable ceramic material of AlN with BN. These materials can be made in any shape including hollow and concave. Despite the good machineability, the above-mentioned materials have high thermal conductivity (90-100 W/mk at 300K).

Due to the good processibility, the housing produced from the above-mentioned materials permits a further development of the above-mentioned embodiment, in which the housing is produced in one piece. This housing has no connecting spots or glued joints, which is advantageous in particular in view of vacuum tightness of the housing.

In a preferred embodiment of the inventive NMR probe head, the at least one contact location between the separating wall with the at least one heating element is electrically heated or by means of warm fluids. In particular, the electrical design is very advantageous since no media must be transported.

In order to reduce the inherent loss of the RF receiver coil with optimum efficiency, the cryogenic temperature of the RF receiver coil is less than 100K, preferably less than 40K.

The RF receiver coil is thereby advantageously cooled by a refrigerator, and cooling is advantageously performed using a heat-transmitting refrigerant. The temperature may thereby be controlled by the power of the refrigerator.

The advantages of the inventive NMR probe head may be utilized with particular preference in connection with an MRI imaging probe head. The inventive NMR probe head may also be used for spectroscopy purposes, in particular, for combined application of imaging and spectroscopy.

In a particularly preferred embodiment of the inventive NMR probe head, the investigated nuclei comprise protons. This embodiment is particularly suited for investigating living test objects.

The operating frequency of the at least one RF receiver coil is advantageously adjusted to the resonance frequency of the investigated nuclei at an operating magnetic field strength of at least 4.6 T.

For special applications, it may also be advantageous when the nuclei to be investigated comprise $^2H$, $^3He$, $^{13}C$, $^{17}O$, $^{19}F$, $^{23}Na$, $^{31}P$ or $^{129}Xe$ nuclei.

The separating wall may have a thermometer for measuring its temperature in order to control it. The thermometer is easy to mount due to the flexibly designed shape and the high thermal conductivity of the material of the separating wall.

The invention also concerns a method for operating an NMR probe head, wherein the temperature of the housing is measured and advantageously adjusted. The temperature of the housing may thereby be adjusted with high precision to any arbitrary desired value, thereby ensuring that the desired value is kept.

The temperature of the housing is advantageously adjusted to a temperature which is well suited for the temperature-sensitive test object.

This is particularly relevant when the temperature-sensitive test object is a small animal, in particular, a mouse or a rat. The temperature of the housing or of the separating wall is then generally adjusted to the body temperature of the animal to be examined.

In a preferred variant of the inventive method, the temperature of the housing is measured using at least one electric temperature sensor. This may e.g. be a thermometer of the type Pt100 or Pt1000.

The inventive NMR probe head has an optimized RF window for MRI measurement which ideally meets all requirements. It is thereby possible to construct practical cryo-MRI systems which have a long service life and which work with maximum performance. The advantages of the inventive NMR probe head may be particularly utilized especially for small test objects such as e.g. mouse brains.

Further advantages of the invention can be extracted from the description and the drawing. The features mentioned above and below may also be used individually or collectively in arbitrary combination. The embodiments shown and described are not to be understood as exhaustive enumeration but have exemplary character for describing the invention.

DESCRIPTION OF THE PREFERRED EMBODIMENT

Figure 1:
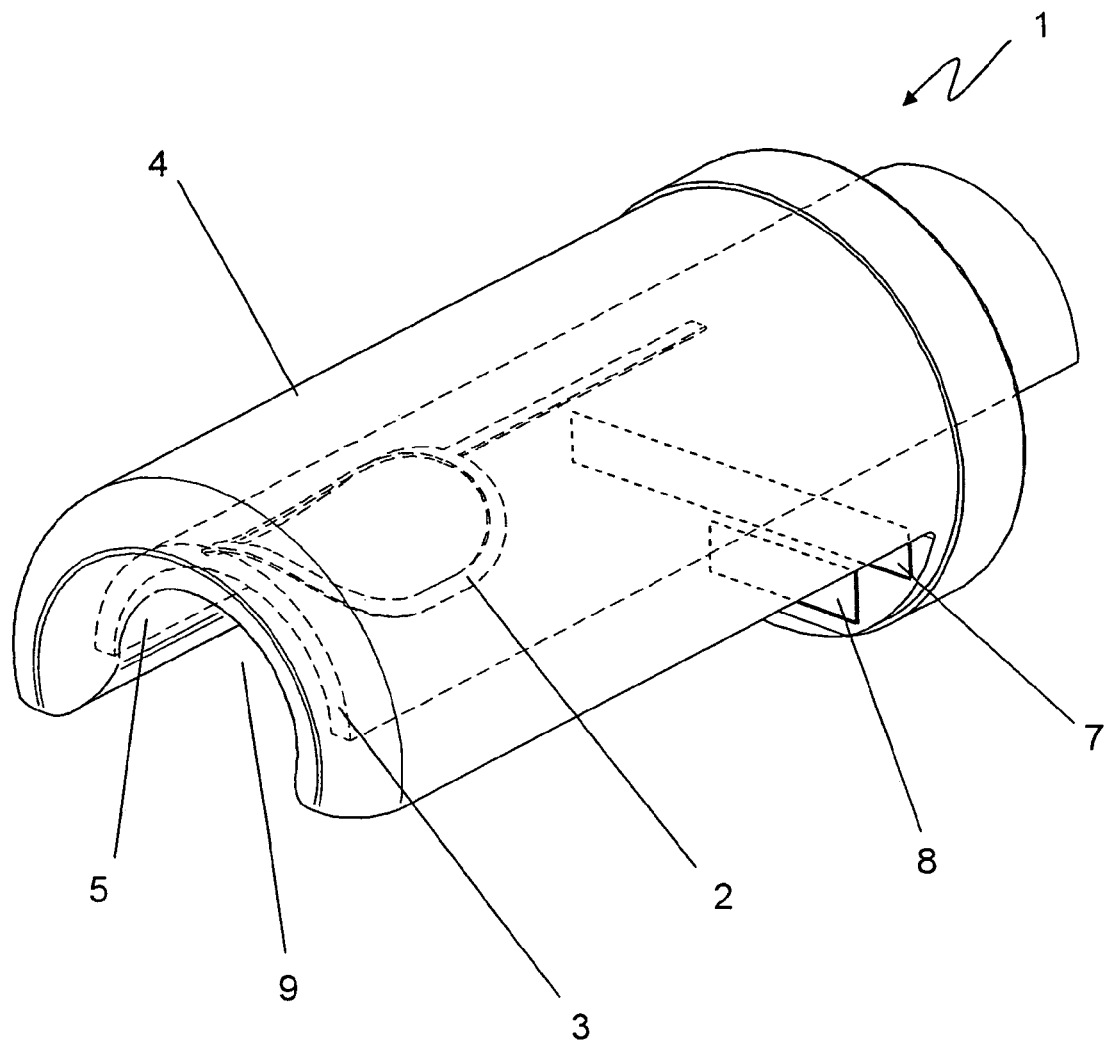
FIG. 1 shows a schematic three-dimensional illustration of an inventive NMR probe head.

FIG. 1 shows a three-dimensional illustration of a relevant part of an inventive NMR probe head 1. An RF receiver coil 2 is used to receive the RF signals emitted by the test object. It may also be designed as a transmitter/receiver coil and also be used for transmitting excitation signals. The RF receiver coil 2 is in contact with a cold finger 3 which is cooled e.g. by a refrigerator (not shown) in order to maintain the RF receiver coil 2 at a cryogenic temperature. The RF receiver coil 2 is thereby cooled through thermal conduction from the refrigerator via the cold finger 3 to the RF receiver coil 2. The material of the cold finger should thereby have a high thermal conductivity, in particular, at low temperatures. Monocrystals are thereby particularly suited, such as e.g. sapphire. In principle, it is also feasible to cool the RF receiver coil 2 directly without heat exchanger via a heat-transmitting coolant (fluid) e.g. nitrogen or helium, in the liquid or gaseous phase.

A housing 4 comprising a heatable separating wall 5 surrounds the RF receiver coil 2. The separating wall 5 thereby extends between the RF receiver coil 2 and a test object (mouse 6 in FIG. 2) and forms an RF window. In the embodiment shown in FIG. 1, the separating wall 5 is part of the housing 4. The temperature of the separating wall 5 can be controlled in dependence on the respective application using a heating element 7 which is disposed outside of the volume under investigation 9. The heating element 7 is disposed at a sufficiently large separation from the RF receiver coil 2 (i.e. outside of the actual RF window), such that the heating element 7 has no disturbing effect on the NMR data to be produced. This external arrangement of the heating element 7 is achieved through suitable material selection (good thermal conductivity, poor electrical conductivity) such that heat can be transferred from one contact point of the external heating element 7 through thermal conduction via the material of the separating wall 5 to the area of the RF window, i.e. to the area where the RF receiver coil 2 and the separating wall 5 are disposed close to each other. The heat is transferred from the contact point of the heating element 7 with the separating wall 5 to the RF window through thermal conduction via the material of the separating wall 5 and not, as in prior art, through convection. The temperature of the separating wall 5 is monitored by a thermometer 8 which is in contact with the separating wall 5 or the housing 4. It is also feasible to adjust the heating performance of the heating element 7 through measurement of the body temperature of the mouse 6 or include it in the adjustment.

Figure 2:
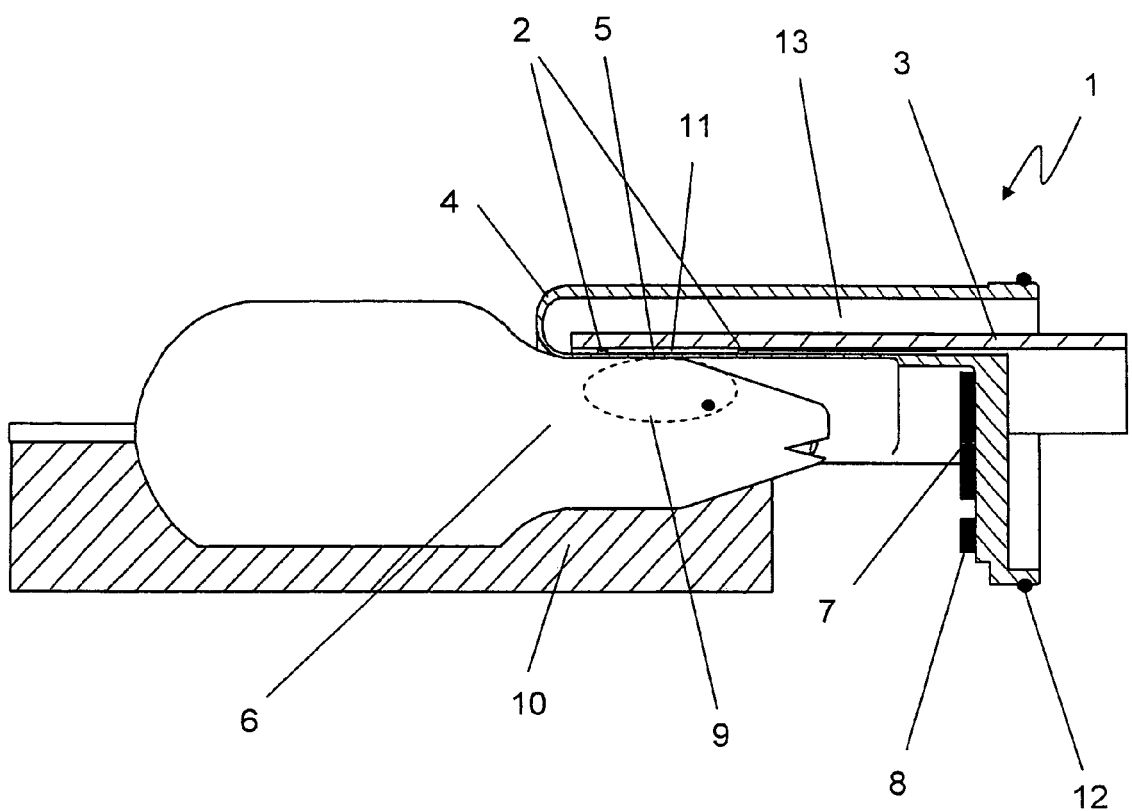
FIG. 2 shows a schematic sectional view of an inventive NMR probe head with test object.

FIG. 2 shows an inventive NMR probe head 1 with a mouse 6 as test object, which is fixed to an animal support 10. The mouse 6 is fixed on the animal support 10 in order to investigate its brain. The mouse brain to be investigated is directly below the RF receiver coil 2 in the volume under investigation 9. The separating wall 5 which separates the RF receiver coil 2 from the mouse is thereby directly in contact with the mouse 6 such that the separation between the RF receiver coil 2 and the mouse 6 is minimized. In this fashion, the signal/noise ratio of the NMR measurements can be considerably improved compared to measurements with the NMR probe head of prior art. This is achieved in that the separating wall 5 is heated via the external heating element 7 and the temperature of the separating wall 5 is adjusted using the thermometer 8 in order to prevent cooling of the mouse 6 by the cryogenically cooled RF receiver coil 2.

The housing 4 including separating wall 5 preferably consists of an aluminium-nitride containing ceramic material which has low electric conductivity and high thermal conductivity and which is easy to process. Even housings having a complex shape can thereby be produced with the desired features, e.g. RF permeability and good heat conduction. This large variability concerning the shape of the housing 4 permits i.a. to design connections to e.g. a vacuum pump using a flexible O-ring 12 outside of the volume under investigation 9. The separating wall 5 itself may thereby even withstand large temperature fluctuations which may occur e.g. during malfunction, vacuum breakdown, or during transport, without producing cracks or the like at connecting points between parts that are produced from the same or other materials.

The housing 4 is preferably evacuated in order to further reduce heat transfer from the mouse 6 to the RF receiver coil 2 via the housing 4 or its separating wall 5, thereby preventing excessive cooling of the mouse 6. It would also be feasible to fill the space 11 between the separating wall 5 and the RF receiver coil 2 as well as the remaining space 13 in the housing with a heat-insulating material (e.g. foamed polystyrene).

The inventive NMR probe head 1 minimizes the separation between the RF receiver coil 2 and the test object without inadmissibly cooling the latter. Moreover, disturbing influences by a heating medium in the volume under investigation are prevented. This improves the quality of reception of the NMR signals and thereby the quality of the NMR recordings.

LIST OF REFERENCE NUMERALS

1 NMR probe head
2 RF receiver coil
3 cold finger
4 housing
5 separating wall
6 mouse
7 heating element
8 thermometer
9 volume under investigation
10 animal support
11 space between the separating wall and the RF receiver coil
12 O-ring
13 room in the housing

We claim:

1. An NMR probe head for investigating a temperature-sensitive test object in a volume under investigation, the probe head comprising:
   a housing;
   at least one RF receiver coil disposed within said housing, said receiver coil being cooled to a cryogenic temperature during operation of the probe head;
   a separating wall disposed between said RF receiver coil and the test object, said separating wall comprising a material having excellent heat conduction properties;
   a heating element disposed at a separation from the volume under investigation; and
   means for thermally coupling said separating wall to said heating element.

2. The NMR probe head of claim 1, wherein said housing is an evacuated housing.

3. The NMR probe head of claim 1, wherein said separating wall is integral with said housing.

4. The NMR probe head of claim 1, wherein said separating wall has a thickness of less than 1 mm or of approximately ½ mm.

5. The NMR probe head of claim 1, wherein an electrical conductivity of a material of said separating wall at an operating temperature thereof is less than $10^{-3}$ S/m, less than $10^{-5}$ S/m, or less than $10^{-8}$ S/m.

6. The NMR probe head of claim 1, wherein a thermal conductivity of a material of said separating wall at an operating temperature thereof is more than 15 $WK^{-1} m^{-1}$ or more than 80 $WK^{-1} m^{-1}$.

7. The NMR probe head of claim 1, wherein material of said separating wall comprises aluminium nitride (AlN), beryllium oxide (BeO), aluminium oxide ($Al_2O_3$), boron nitride (BN), or magnesium oxide (MgO).

8. The NMR probe head of claim 1, wherein a separation between said RF receiver coil and an accessible volume under investigation is <2 mm or ≦1 mm.

9. The NMR probe head of claim 1, wherein said housing is produced from a ceramic material containing aluminium nitride or from a machineable ceramic material of AlN with BN.

10. The NMR probe head of claim 9, wherein said housing is produced in one piece.

11. The NMR probe head of claim 1, wherein said thermal coupling means is electrically heated or heated using warm fluids.

12. The NMR probe head of claim 1, wherein a cryogenic temperature of said RF receiver coil is less than 100K or less than 40K.

13. The NMR probe head of claim 1, wherein said RF receiver coil is cooled by a refrigerator or by cooling means having a heat-transmitting coolant.

14. The NMR probe head of claim 1, wherein the probe head is an MRI probe head for imaging.

15. The NMR probe head of claim 1, wherein investigated nuclei comprise protons.

16. The NMR probe head of claim 1, wherein an operating frequency of said at least one RF receiver coil is matched to a resonance frequency of investigated nuclei at an operating magnetic field strength of at least 4.6 T.

17. The NMR probe head of claim 1, wherein investigated nuclei comprise $^2H$, $^3He$, $^{129}Xe$, $^{13}C$, $^{17}O$, $^{19}F$, $^{23}Na$, or $^{31}P$ nuclei.

18. The NMR probe head of claim 1, wherein said separating wall is provided with a thermometer for measuring a temperature thereof.

19. A method for operating the NMR probe head of claim 1, wherein a temperature of said housing is measured and preferably adjusted.

20. The method of claim 19, wherein the temperature of said housing is adjusted to a temperature which is well suited for the temperature-sensitive test object.

21. The method of claim 20, wherein the temperature-sensitive test object is a small animal, a mouse, or a rat.

22. The method of claim 19, wherein the temperature of said housing is measured using at least one electrical temperature sensor.

* * * * *